(12) United States Patent
Nie et al.

(10) Patent No.: US 10,690,742 B2
(45) Date of Patent: Jun. 23, 2020

(54) METHOD AND APPARATUS FOR CALIBRATING CENTER FREQUENCY OF MR AND MRI SYSTEM

(71) Applicant: GENERAL ELECTRIC COMPANY, Schenectady, NY (US)

(72) Inventors: Lisha Nie, Beijing (CN); Yongchuan Lai, Beijing (CN); Tongzhou Wang, Beijing (CN); Tengfei Wang, Beijing (CN)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/361,913

(22) Filed: Mar. 22, 2019

(65) Prior Publication Data

US 2019/0302212 A1 Oct. 3, 2019

(30) Foreign Application Priority Data

Mar. 29, 2018 (CN) .......................... 2018 1 0270364

(51) Int. Cl.
  *G01R 33/58* (2006.01)
  *G01R 33/385* (2006.01)
  *G01R 33/48* (2006.01)
  *G01R 33/54* (2006.01)
  *G01R 33/56* (2006.01)

(52) U.S. Cl.
  CPC ......... *G01R 33/583* (2013.01); *G01R 33/385* (2013.01); *G01R 33/4818* (2013.01); *G01R 33/543* (2013.01); *G01R 33/5608* (2013.01)

(58) Field of Classification Search
  CPC .............. G01R 33/583; G01R 33/5608; G01R 33/543; G01R 33/4818; G01R 33/385; A61B 5/055
  See application file for complete search history.

(56) References Cited

U.S. PATENT DOCUMENTS

| 4,593,247 A * | 6/1986 | Glover ............... G01R 33/5604 324/307 |
| 2012/0001635 A1* | 1/2012 | Ookawa ................. A61B 5/055 324/314 |
| 2015/0253411 A1* | 9/2015 | Umeda ............ G01R 33/56518 324/318 |
| 2015/0346309 A1* | 12/2015 | Campagna ........... G01R 33/543 324/307 |
| 2019/0346521 A1* | 11/2019 | Nitta ..................... G01R 33/543 |

* cited by examiner

*Primary Examiner* — G. M. A Hyder

(57) ABSTRACT

Methods and apparatuses for calibrating a center frequency of MR and an MRI system are disclosed herein. An exemplary method comprises applying a first set of gradient fields, receiving data information acquired by an RF coil and generating a first image; applying a second set of gradient fields in directions different than those of the first set of gradient fields, receiving data information acquired by the RF coil and generating a second image; calculating a shift of the center frequency based on the first image and the second image; and correcting the center frequency based on the shift of the center frequency.

14 Claims, 4 Drawing Sheets

METHOD AND APPARATUS FOR CALIBRATING CENTER FREQUENCY OF MR AND MRI SYSTEM

CROSS REFERENCE

The present application claims benefit of and priority to a Chinese Patent Application No. 201810270364.X, filed Mar. 29, 2018, which is incorporated herein by reference in its entirety.

FIELD

The present disclosure relates to the field of medical imaging, particularly to a method and apparatus for calibrating a center frequency of magnetic resonance (MR), and a magnetic resonance imaging (MRI) system.

BACKGROUND

In MRI, a uniform strong magnetic field is generated by a magnet, where precession frequencies of protons in an organism are determined by the field strength and are consistent with each other. If a linear gradient magnetic field is added into the main magnetic field, the precession frequencies of proton groups in various parts of a subject being detected may be distinguished from each other due to different magnetic induction intensities, and thus MRI may be performed on a certain part of the subject being detected. A radio frequency (RF) pulse may excite the protons to generate resonance. When a precession frequency of a proton is the same as a center frequency of the RF pulse, energy exchange can occur, and a proton with a low energy obtains energy to enter into a high energy state, i.e., generating nuclear magnetic resonance (NMR). The center frequency of the RF pulse is a very critical parameter in MRI. If the center frequency is not accurate, it will directly result in misalignment of the obtained MR image.

Usually, the center frequency is calibrated by pre-scanning During the pre-scanning, a system may be adjusted using a specially-made MR sample model to determine an optimal resonance frequency (center frequency). It is very accurate to calibrate the center frequency by pre-scanning. However, the method of pre-scanning requires a carrying bed be located at an initial position and kept still. For a carrying bed that is constantly moving, it is very difficult to calibrate the center frequency by the method of pre-scanning.

Therefore, a method for calibrating the center frequency of MR is desired.

SUMMARY

An objective of the present disclosure is to provide a method and apparatus for calibrating a center frequency of MR and an MRI system.

Exemplary embodiments of the present disclosure provide a method for calibrating a center frequency of MR. The method comprises applying a first set of gradient fields, receiving data information acquired by an RF coil and generating a first image; applying a second set of gradient fields in directions different than those of the first set of gradient fields, receiving data information acquired by the RF coil and generating a second image; calculating a shift of the center frequency based on the first image and the second image; and correcting the center frequency based on the shift of the center frequency.

The exemplary embodiments of the present disclosure also provide an apparatus for calibrating a center frequency of MR. The apparatus comprises a first module, a second module, and a third module. The first module is configured to control a gradient system to apply a first set of gradient fields and a second set of gradient fields. Directions of the second set of gradient fields are different than directions of the first set of gradient fields. The second module is configured to receive data information acquired by an RF coil and generate a first image in response to the first set of gradient fields being applied, and receive data information acquired by the RF coil and generate a second image in response to the second set of gradient fields being applied. The third module is connected to the second module and configured to calculate a shift of the center frequency based on the first image and the second image, and the third module is connected to the first module that is configured to correct the center frequency based on the shift of the center frequency calculated by the third module.

The exemplary embodiments of the present disclosure further provide a non-transitory computer readable medium storing instructions, when executed by a processor, causing the processor to perform the method for calibrating a center frequency of MR.

Other features and aspects will be apparent from the following detailed description, drawings, and claims.

BRIEF DESCRIPTION OF THE DRAWINGS

The disclosure may be better understood by the description of the exemplary embodiments of the present disclosure in conjunction with the accompanying drawings, in which.

DETAILED DESCRIPTION

In the following, specific embodiments of the present disclosure will be described. It should be noted that, in the detailed description of these embodiments, all features of the actual embodiments may not be described in detail for conciseness of the description. It should be understood, in actual implementation of any one of the embodiments, just as in any one engineering project or designing project, in order to achieve the developers' specific goals and in order to meet system-related or business-related restrictions, a variety of concrete decisions are often made, and this varies from one implementation to another. In addition, it should also be understood, although the effort made in such developing process may be complex and time-consuming, some variations such as design, manufacture and production on the basis of the technical contents disclosed in the disclosure are just customary technical means in the art for one of ordinary skilled in the art associated with the contents disclosed in the present disclosure, which should not be regarded as insufficient disclosure of the present disclosure.

Unless otherwise defined, all technical or scientific terms used in the claims and the description should be interpreted in the ordinary sense to one of ordinary skills in the art to which this invention belongs. The terms "first", "second," and similar terms used in the description and claims of the present invention do not imply any order, quantity, or importance, but are merely used to distinguish between different components. "One", "a/an", or similar terms do not imply any limitation on the number, but rather means "at least one". "Including" or "comprising" and the like means that an element or item appearing before "including" or "comprising" an element or item and its equivalents listed after "including" or "comprising", and does not exclude other elements or items. "Connected", "coupled" and the like are not limited to physical or mechanical connections, nor are they limited to direct or indirect connections.

Figure 1:
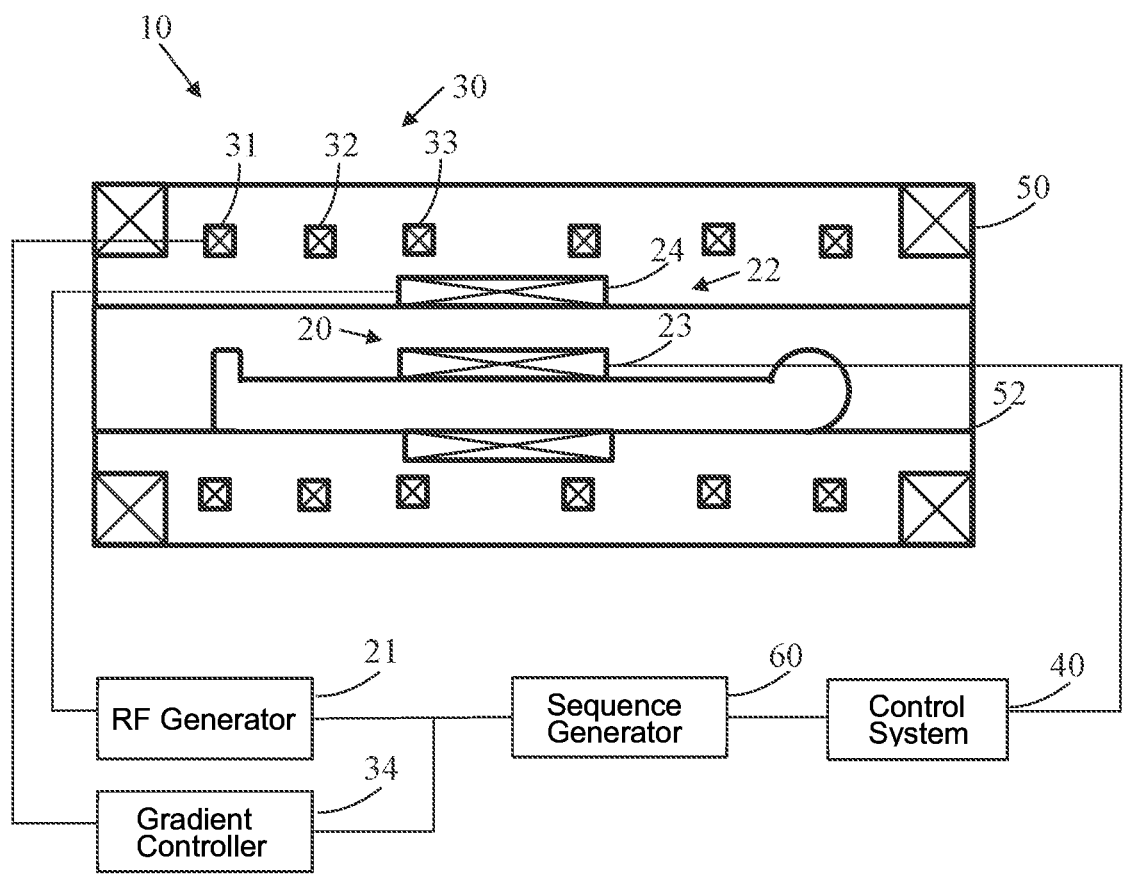
FIG. 1 is a block diagram of an MRI system in accordance with one embodiment of the present disclosure.

FIG. 1 illustrates a block diagram of an MRI system in accordance with one embodiment of the present disclosure. As shown in FIG. 1, the MRI system 10 includes an RF system 20, a gradient system 30, a control system 40, and a main magnet 50. A hollow portion of the main magnet 50 forms a scanning cavity. A carrying bed 52 for carrying an object (e.g., human body) to be detected can enter the scanning cavity for performing MRI on the object to be detected. A static magnetic field Bo generated by the main magnet 50 causes the object being detected in the scanning cavity to generate a longitudinal macro magnetization vector.

The RF system 20 includes an RF generator 21 and an RF coil 22. The RF coil 22 may include an RF receiving coil 23 and an RF transmitting coil 24. The RF coil includes a body coil with a great volume and a surface coil with a small volume. The body coil may serve as an RF transmitting coil and/or RF receiving coil, and the surface coil may serve as an RF receiving coil. The RF generator 21 is used to emit an RF excitation pulse to the RF transmitting coil 24 to excite a longitudinal magnetization vector of the object being detected to flip, thereby generating a transverse magnetization vector. After the RF excitation pulse ends, the transverse magnetization vector decays spirally about an external magnetic field at a fixed angular frequency to generate a free induction decay (FID) signal. By acquiring and analyzing the FID signal, the RF receiving coil 23 may generate an MR signal used to image the object being detected. The center frequency of the RF excitation pulse is a very critical parameter for the MRI.

The gradient system includes gradient coils 31, 32, and 33 arranged in different directions (e.g., in upper-lower, left-right, and anterior-posterior directions of the human body, corresponding to Z-axis, X-axis, and Y-axis of a reconstruction coordinate) and a gradient controller 34. The gradient controller 34 is used to emit gradient pulses to the gradient coils 31, 32, and 33 to linearly superimpose a gradient field on the static magnetic field, thus achieving spatial localization of the MR signal, and allowing generation of an MR image for any slice or volume.

The control system 40 is, on one hand, used to generate a pulse control sequence which is transmitted via a sequence generator 60 to the RF generator 21, the gradient controller 34 and the like. The RF generator 21, the gradient controller 34 and the like respectively perform the RF timing and the gradient timing in the pulse control sequence and the MR signal is acquired during a specific period of time of the timings. The control system 40 is, on the other hand, used to perform image reconstruction based on the acquired MR signal.

Figure 2:
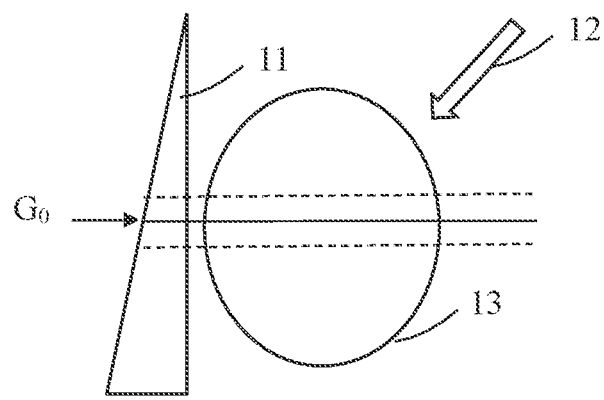
FIGS. 2-4 are principle schematic diagrams in accordance with one embodiment of the present disclosure.
Figure 3:
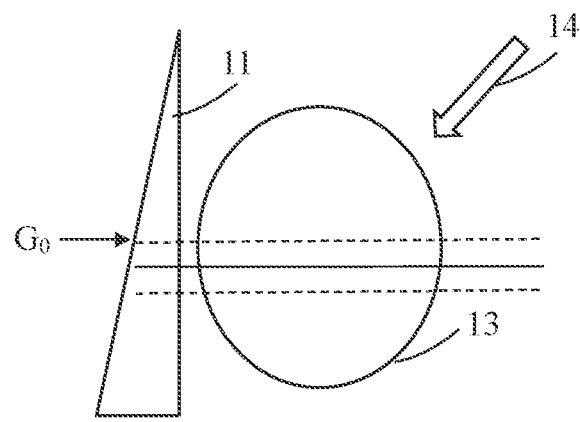
Figure 4:
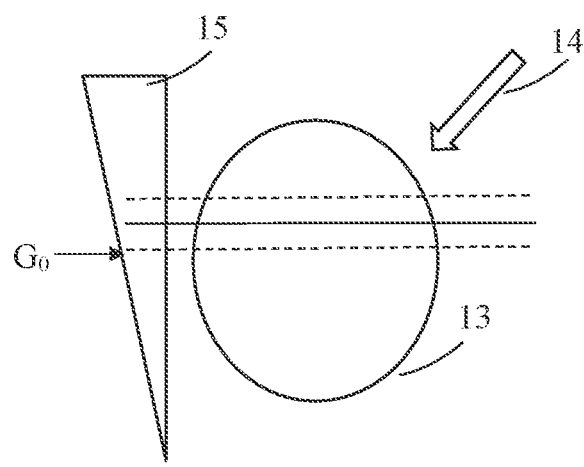

FIGS. 2-4 illustrate principle schematic diagrams according to one embodiment of the present disclosure. In FIGS. 2-4, Go represents a midpoint of the gradient fields 11, 15. The horizontal solid line in each figure represents a position of an excited slice (center of the slice) of the object 13 being detected, and the two horizontal dotted lines in each figure represent a thickness of the slice. As shown in FIG. 2, take applying a gradient field 11 in the Z-axis direction as an example. When the center frequency of the emitted RF pulse 12 is accurate, i.e., equal to the precession frequency of protons, the position of the excited slice of the object 13 being detected is right at the midpoint Go of the gradient field. In one embodiment, take an MR scanner of 1.5 T as an example. At a field strength of 1.5 T, the precession frequency of the protons is about 64 MHZ. If the frequency of the emitted RF pulse is 63.5~64.5 MHZ, then the position of the excited slice would be at the midpoint Go of the gradient field, and the thickness of the slice would be 1 cm, i.e., the range of the thickness of the slice including a range of 0.5 cm upward and downward respectively from the midpoint Go of the gradient field.

Based on the above, as shown in FIG. 3, in the same gradient field 11, when the center frequency of the emitted RF pulse 14 is inaccurate with a shift, i.e., the center frequency of the RF pulse is not equal to the precession frequency of the protons, then the position of the excited slice of the object 13 being detected would also have a shift relative to the midpoint Go of the gradient field. Take still the MR scanner of 1.5 T as an example. If the center frequency of the emitted RF pulse 14 is greater by 0.5 MHZ, i.e., the frequency of the emitted RF pulse 14 is 64~65 MHZ, then the position of the excited slice would be shifted by 0.5 cm relative to the midpoint of the gradient field towards where the gradient field strength is greater. Therefore, a shift of the center frequency would directly lead to a shift of the position of the excited slice. Thus, the shift of the center frequency may be determined and calculated by the shift of the position of the excited slice. In order to calculate the shift of the position of the excited slice of the object being detected, as shown in FIG. 4, a gradient field 15 in a direction opposite to that of the gradient field 11 may be further applied. Still the RF pulse 14 is emitted, whose center frequency is shifted, then the position of the excited slice of the object 13 being detected shifts to an opposite direction relative to the midpoint of the gradient field. Take still the MR scanner of 1.5 T as an example. If a gradient field 15 in a direction different from that of the gradient field 11 is applied, and still an RF pulse of 64~65 MHZ is emitted, then the position of the excited slice would be shifted by 0.5 cm relative to the midpoint of the gradient field towards where the gradient field strength is greater.

Thus, the shift of the center frequency may be calculated by acquiring data information in the two sets of gradient fields in opposing directions by the RF receiving coil, generating two images and calculating the shift between the two images. If the center frequency is accurate without a shift, with the two sets of gradient fields applied in opposite directions, the two images generated by acquiring the data information should coincide with each other. Therefore, the present disclosure calculates the shift of the center frequency by applying two sets of gradient fields in opposite directions, acquiring the data information and generating two images, and calculating the shift between the two images.

Figure 5:
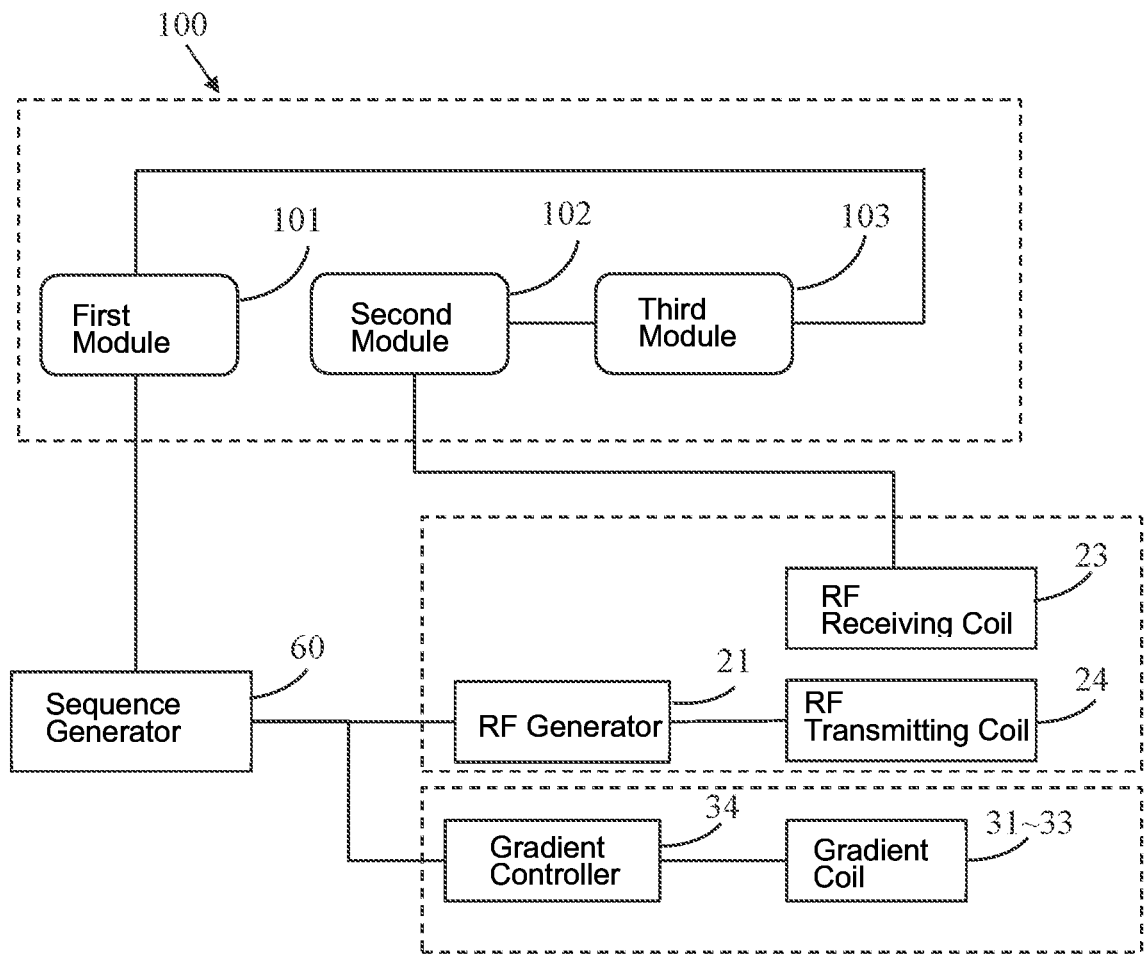
FIG. 5 is a structural schematic diagram of an apparatus for calibrating a center frequency of MR in accordance with one embodiment of the present disclosure.

FIG. 5 illustrates a schematic diagram of an apparatus for calibrating a center frequency according to one embodiment of the present disclosure. As shown in FIG. 5, an apparatus 100 for calibrating a center frequency of MR includes a first module 101, a second module 102, and a third module 103. The first module 101 is used to control the gradient system to apply a first set of gradient fields and a second set of gradient fields, wherein the directions of the second set of gradient fields are different than those of the first set of gradient fields, preferably, the second set of gradient fields are in directions opposite to the first set of gradient fields. In one embodiment, the second set of gradient fields are in different directions from the first set of gradient fields in all the X, Y, and Z axes. In one embodiment, the first module 101 is connected to the sequence generator 60. The first module 101 may generate two sets of control instructions which are transmitted to the RF generator 21 and the gradient controller 34 via the sequence generator 60. The RF generator 21 emits an RF pulse to the RF transmitting coil 24. The gradient controller 34 may emit gradient pulses to the gradient coils 31-33 to apply two sets of gradient fields in different directions. In one embodiment, the first module 101 may generate multiple sets of control instructions to apply multiple sets of gradient fields. The second module 102 is used to receive the data information acquired by the RF coil and generate a first image when the first module 101 applies the first set of gradient fields, and receive the data information acquired by the RF coil and generate a second image when the first module 101 applies the second set of gradient fields. In one embodiment, in the MRI system, the second module 102 is connected to the RF receiving coil 23 to receive the data information acquired by the RF receiving coil 23. The third module 103 is connected to the second module 102 and used to calculate the shift of the center frequency based on the first image and the second image obtained by the second module 102. Meanwhile, the third module 103 is connected to the first module 101 and sends the calculated shift of the center frequency to the first module 101, which corrects the center frequency based on the shift of the center frequency calculated by the third module 103. The above modules are not limited to hardware modules, but may also include software modules or program modules. In one embodiment, the apparatus 100 for calibrating the center frequency of MR is integrated in the control system 40 of the MRI system 10.

In one embodiment, firstly, the first module 101 may transmit a first set of control instructions to the gradient controller 34 and the RF generator 21 for emitting RF pulses and applying a first set of gradient fields. Meanwhile, the second module 102 receives the data information acquired by one of the body coil and the surface coil during a specific period of time of timings and generates a first image. Then, the first module 101 transmits a second set of control instructions to the gradient controller 34 and the RF generator 21 for applying a second set of gradient fields in directions different than those of the first set of gradient fields. Meanwhile, the second module 102 receives the data information acquired by one of the body coil and the surface coil and generates a second image. In one embodiment, after receiving the data information acquired by the RF receiving coil, the second module 102 fills the K space with the received data information, and then performs a Fourier transformation on the data filled into the K space to obtain a corresponding image. In one embodiment, the first set of control instructions and/or second set of control instructions transmitted by the first module 101 are pulse control sequences. In one embodiment, in the first set of gradient fields, the second module 102 receives the data information acquired by the body coil; in the second set of gradient fields, the second module 102 receives the data information acquired by the surface coil. In another embodiment, in the first set of gradient fields, the second module 102 receives the data information acquired by the surface coil; in the second set of gradient fields, the second module 102 receives the data information acquired by the body coil.

In another embodiment, firstly, the first module 101 may transmit a first set of control instructions to the gradient controller 34 and the RF generator 21 for applying a first set of gradient fields. Meanwhile, the second module 102 receives the data information acquired by the body coil (or the surface coil) and generates a first image. Then, the first module 101 transmits a second set of control instructions to the gradient controller 34 and the RF generator 21 for applying a second set of gradient fields in directions different from those of the first set of gradient fields. Meanwhile, the second module 102 receives the data information acquired by the body coil (or the surface coil) and generates a second image.

In one embodiment, the third module 103 may determine a shift of pixels between the first image and the second image that are obtained at the second module 102, e.g., obtaining the shift of pixels by calculating how many pixels need to be shifted between the first image and the second image can the two images coincide with each other completely. The third module 103 may also calculate the shift of the center frequency based on a field of view (FOV) preset by the system and an acquired bandwidth according to the following equation:

$$\frac{PixelShift\_x}{FOV\_x} = \frac{CFShift}{2 \times Bandwidth}$$

wherein PixelShift_x is the shift of pixels, FOV_x is the FOV, CFShift is the shift of the center frequency, and Bandwidth is the acquired bandwidth. Therefore, the shift of the center frequency CFShift is:

$$CFShift=(PixelShift\_x \times 2 \times Bandwidth)/(FOV\_x)$$

Figure 6:
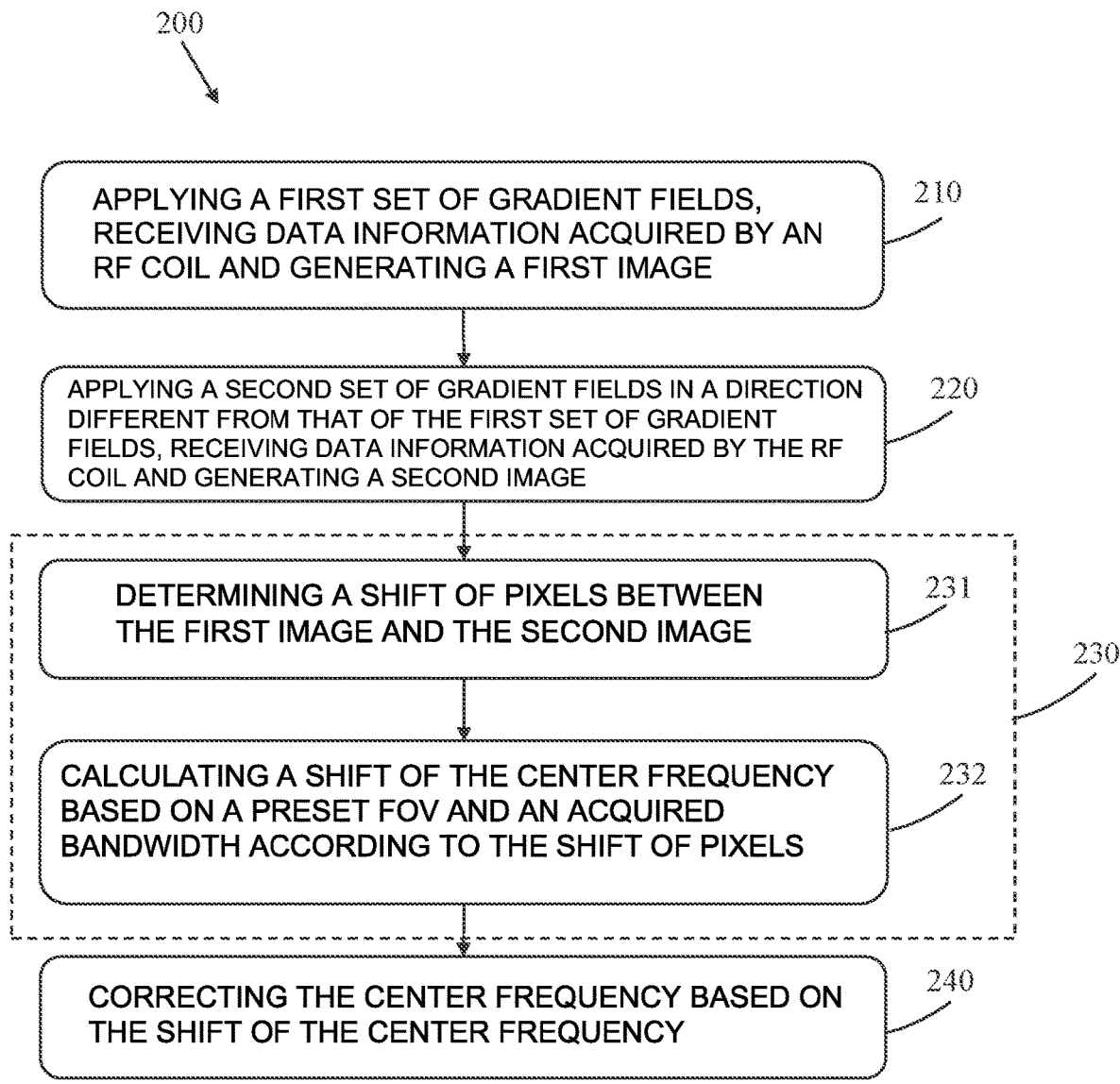
FIG. 6 is a flow chart of a method for calibrating a center frequency of MR in accordance with one embodiment of the present disclosure.

FIG. 6 illustrates a flow chart of a method 200 for calibrating a center frequency of MR in accordance with one embodiment of the present disclosure. As shown in FIG. 6, the method 200 for calibrating a center frequency of MR includes the following operations.

In operation 210, a first set of gradient fields are applied, data information acquired by an RF coil is received and a first image is generated. In one embodiment, receiving data information acquired by the RF coil includes: receiving data information acquired by any one of the body coil and the surface coil.

In one embodiment, receiving data information acquired by the RF coil and generating a first image includes: receiving data information acquired by the RF receiving coil and filling the K space with the acquired data information, then performing a Fourier transformation on the data filled into the K space to obtain the first image.

In operation 220, a second set of gradient fields in directions different than those of the first set of gradient fields are applied, data information acquired by the RF coil is received and a second image is generated. In a preferred embodiment, all of the second set of gradient fields are opposite to the gradient fields of the first set of gradient fields in the axial directions.

In one embodiment, receiving data information acquired by the RF coil includes receiving data information acquired by any one of the body coil and the surface coil, wherein the one of the body coil and the surface coil that acquires the data information in step 220 may be the same as, or may be different than the one of the body coil and the surface coil that acquires the data information in step 210. For example, in step 210, the data information acquired by the body coil (or the surface coil) is received, and in step 220, the data information acquired by the surface coil (or the body coil) is received. If the coils for acquiring data information in the two steps are different, a coil switch between the body coil and the surface coil may be switched between step 210 and step 220.

In one embodiment, receiving data information acquired by the RF coil and generating a second image includes receiving data information acquired by the RF receiving coil and filling the K space with the acquired data information, then performing a Fourier transformation on the data filled into the K space to obtain the second image.

In operation 230, a shift of a center frequency is calculated based on the first image and the second image. In one embodiment, operation 230 includes the following steps:

In step 231, a shift of pixels between the first image and the second image is determined. In one embodiment, when the center frequency is accurate, the first image and the second image should coincide with each other completely, while when there is certain shift between the first image and the second image, the shift of pixels may be determined by calculating how many pixels need to be shifted between the first image and the second image so that the two images coincide.

In step 232, the shift of the center frequency is calculated based on a preset FOV and an acquired bandwidth according to the shift of pixels. In one embodiment, the FOV and the acquired bandwidth are both preset. After calculating the shift of pixels between the first image and the second image according to step 231, the shift of the center frequency may just be calculated according to the following equation:

$$CFShift = (PixelShift\_x \times 2 \times Bandwidth)/(FOV\_x)$$

wherein PixelShift_x is the shift of pixels, FOV_x is the FOV, CFShift is the shift of the center frequency, and Bandwidth is the acquired bandwidth.

In step 240, the center frequency is corrected based on the shift of the center frequency.

The method for calibrating a center frequency of MR disclosed by the present application can be performed to correct the center frequency for an MRI system with a constantly moving carrying bed. And the method can be performed to correct the center frequency at any time, e.g., correcting the center frequency while detecting the object being detected (e.g., patient), with no extra time.

The present disclosure may also provide non-transitory computer readable media storing instructions, when executed by a processor, causing an MRI system to carry out the above method for calibrating the center frequency. Specifically, the instructions may run by a control system of the MR system.

For example, the non-transitory computer readable media may store the following instructions:

Instruction One: transmitting, respectively, a first set of control instructions and a second set of control instructions to the gradient controller and the RF generator;

Instruction Two: receiving the data information acquired by any one of the body coil and the surface coil;

Instruction Three: generating a first image and a second image based on the acquired data information;

Instruction Four: calculating a shift of the center frequency based on the first image and the second image; and Instruction Five: correcting the center frequency based on the shift of the center frequency.

Note that Instruction Four may include the following sub-instructions: determining a shift of pixels between the first image and the second image; calculating the shift of the center frequency based on a preset FOV and an acquired bandwidth according to the shift of pixels.

Some exemplary embodiments have been described above. However, it should be appreciated that various modifications may be made. For example, if the described techniques are performed in a different order and/or if the components of the described systems, architecture, devices, or circuits are combined in a different way and/or replaced or supplemented with additional components or equivalents thereof, suitable results can be achieved. Accordingly, other embodiments also fall within the scope of the appended claims.

What is claimed is:

1. A method for calibrating a center frequency of magnetic resonance (MR), the method comprising:
   applying a first set of gradient fields, receiving data information acquired by an RF coil and generating a first image;
   applying a second set of gradient fields in directions different than those of the first set of gradient fields, receiving data information acquired by the RF coil and generating a second image;
   calculating a shift of the center frequency based on the first image and the second image; and
   correcting the center frequency based on the shift of the center frequency.

2. The method of claim 1, wherein receiving data information acquired by the RF coil comprises:
   receiving data information acquired by one of a body coil and a surface coil.

3. The method of claim 1, wherein calculating a shift of the center frequency based on the first image and the second image comprises:
   determining a shift of pixels between the first image and the second image; and
   calculating the shift of the center frequency based on a preset field of view (FOV) and an acquired bandwidth according to the shift of pixels.

4. The method of claim 3, wherein the shift of the center frequency is obtained according to the following equation:

$$CFShift = (PixelShift\_x \times 2 \times Bandwidth)/(FOV\_x)$$

wherein CFShift is the shift of the center frequency, Bandwidth is the acquired bandwidth, PixelShift_x is the shift of pixels, and FOV_x is the FOV.

5. The method of claim 1, wherein the directions of the second set of gradient fields are opposite to the directions of the first set of gradient fields.

6. An apparatus for calibrating a center frequency of MR, the apparatus comprising:
   a first module configured to control a gradient system to apply a first set of gradient fields and a second set of gradient fields, wherein the directions of the second set of gradient fields are different than those of the first set of gradient fields;
   a second module configured to receive data information acquired by an RF coil and generate a first image in response to the first set of gradient fields being applied, and receive data information acquired by the RF coil and generate a second image in response to the second set of gradient fields being applied; and
   a third module connected to the second module and configured to calculate a shift of the center frequency based on the first image and the second image, wherein the third module is connected to the first module that is configured to correct the center frequency based on the shift of the center frequency calculated by the third module.

7. The apparatus of claim 6, wherein the RF coil comprises a body coil and a surface coil, and wherein the second module receives data information acquired by one of the body coil and the surface coil.

8. The apparatus of claim 6, wherein calculating a shift of the center frequency by the third module comprises determining a shift of pixels between the first image and the second image, and calculating the shift of the center frequency based on a preset FOV and an acquired bandwidth according to the shift of pixels.

9. The apparatus of claim 8, wherein the shift of the center frequency is obtained according to the following equation:

$$CFShift = (PixelShift\_x \times 2 \times Bandwidth)/(FOV\_x)$$

wherein CFShift is the shift of the center frequency, Bandwidth is the acquired bandwidth, PixelShift_x is the shift of pixels, and FOV_x is the FOV.

10. The apparatus of claim 6, wherein the directions of the second set of gradient fields are opposite to the directions of the first set of gradient fields.

11. A non-transitory computer readable media storing instructions, when executed by a processor, causing the processor to:

control a gradient system to apply a first set of gradient fields and a second set of gradient fields, wherein the directions of the second set of gradient fields are different than those of the first set of gradient fields;

receive data information acquired by an RF coil and generate a first image in response to the first set of gradient fields being applied, and receive data information acquired by the RF coil and generate a second image in response to the second set of gradient fields being applied;

calculate a shift of the center frequency based on the first image and the second image; and correct the center frequency based on the shift of the center frequency calculated by the third module.

12. The non-transitory computer readable media of claim 11, wherein calculating a shift of the center frequency based on the first image and the second image comprises:

determining a shift of pixels between the first image and the second image; and calculating the shift of the center frequency based on a preset field of view (FOV) and an acquired bandwidth according to the shift of pixels.

13. The non-transitory computer readable media of claim 12, wherein the shift of the center frequency is obtained according to the following equation:

$$CFShift = (PixelShift\_x \times 2 \times Bandwidth)/(FOV\_x)$$

wherein CFShift is the shift of the center frequency, Bandwidth is the acquired bandwidth, PixelShift_x is the shift of pixels, and FOV_x is the FOV.

14. The non-transitory computer readable media of claim 11, wherein the directions of the second set of gradient fields are opposite to the directions of the first set of gradient fields.

* * * * *